United States Patent
Hirzmann

(10) Patent No.: US 6,535,394 B1
(45) Date of Patent: Mar. 18, 2003

(54) PRINTED CIRCUIT BOARD ATTACHMENT STRUCTURE

(75) Inventor: Claus Hirzmann, St Ismier (FR)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/401,548

(22) Filed: Sep. 22, 1999

(30) Foreign Application Priority Data

Apr. 19, 1999 (EP) .............................................. 99400968

(51) Int. Cl.[7] .............................. H05K 7/02; H05K 7/06; H05K 7/08; H05K 7/10
(52) U.S. Cl. ........................ 361/761; 361/758; 361/742; 361/803; 361/799; 361/770; 361/753; 174/138 E; 174/138 G
(58) Field of Search ......................... 361/758, 801–802, 361/799, 752–753, 770, 769, 787, 736, 742, 760; 174/138 E, 51, 138 G; 339/171 F; 439/71, 761, 536, 535, 95

(56) References Cited

U.S. PATENT DOCUMENTS

| | | | | |
|---|---|---|---|---|
| 2,492,115 A | * | 12/1949 | Crowther ........................... | 85/5 |
| 4,063,791 A | * | 12/1977 | Cutchaw .................. | 339/17 CF |
| 4,495,380 A | * | 1/1985 | Ryan et al. .............. | 174/138 D |
| 4,713,611 A | * | 12/1987 | Solstad et al. ........... | 324/158 F |
| 4,901,205 A | * | 2/1990 | Landis et al. ................. | 361/424 |
| 4,953,005 A | * | 8/1990 | Carlson et al. ................ | 357/80 |
| 4,975,142 A | * | 12/1990 | Iannacone et al. ........... | 156/630 |
| 5,127,837 A | * | 7/1992 | Shah et al. ..................... | 439/71 |
| 5,214,569 A | * | 5/1993 | Hsiang ......................... | 361/397 |
| 5,434,746 A | | 7/1995 | Testa et al. ................... | 361/752 |
| 5,620,290 A | * | 4/1997 | Homfeldt et al. ............ | 411/533 |
| 5,754,412 A | * | 5/1998 | Clavin .......................... | 361/804 |
| 5,984,697 A | * | 11/1999 | Moran et al. .................. | 439/92 |
| 6,038,140 A | * | 3/2000 | Petri ............................ | 361/804 |

* cited by examiner

Primary Examiner—David Martin
Assistant Examiner—Thanh Y. Tran

(57) ABSTRACT

Electronic apparatus is described comprising a printed circuit board mounted on a support structure. The printed circuit board has at least one keyhole shaped fixing hole, the support structure being provided with at least one electrically conducting fixing post having an at least partially circumferential slot for engaging the fixing hole. The printed circuit board has a conducting surface adjacent said fixing hole that is disposed to provide an electrical contact with said post so as to establish an electrical circuit between at least one component mounted on the printed circuit board and the support structure. The arrangement is particularly suitable for securely coupling a computer's motherboard to its casing or chassis.

13 Claims, 3 Drawing Sheets

PRINTED CIRCUIT BOARD ATTACHMENT STRUCTURE

FIELD OF THE INVENTION

The present invention relates generally to mechanisms for attaching printed circuit boards to support structures in electronic apparatus. More particularly, the invention relates to an attachment mechanism particularly, but not exclusively, suitable for securely coupling a computer's motherboard to its casing or chassis.

BACKGROUND OF THE INVENTION

In modern personal computer systems, the motherboard is attached to a casing that houses various internal components of the computer. The motherboard typically supports most of the integrated circuits that are included in the computer system. Generally, the motherboard will also include connectors adapted to receive expansion boards as well as to receive expansion memory.

It is important to firmly secure the motherboard within the computer casing so that vibrations caused, for instance, by the computer's ventilation fans or shocks to the computer do not cause expansion boards or memory modules to come loose or other components to be loosened or their connections damaged.

In the prior art, there are a wide variety of different mechanisms that have been used and proposed to secure the motherboard to the chassis. Examples of such arrangements can be found in U.S. Pat. Nos. 5,434,746 and 4,901,205. In practice, however many computer motherboards are simply screwed to the chassis.

U.S. Pat. No. 5,214,569 describes one arrangement in which a plurality of keyhole shaped fitting holes are formed in the motherboard. The holes are adapted to fit over posts extending from the chassis through enlarged opening portions of the holes. The motherboard is then slid over the posts such that the post shafts slide into slot portions of the holes with a head portion of the posts being arranged to fit tightly over the top surface of the motherboard.

In this way, the motherboard can be firmly anchored to the chassis, yet simply and easily removed without the use of tools.

However, since the casing of a personal computer also serves as an electromagnetic shield, a computer motherboard also needs reliable electrical connections to the chassis at a number of different points in order to ground the casing. It is important that these connections are also able to survive the various shocks and vibrations to which the computer may be exposed since the loss of one or more of these connections may modify the EMI performance of the apparatus as a whole. Where the motherboard is screwed to the chassis, these connections are usually provided by the motherboard mounting screws.

This invention is directed to providing a mounting arrangement for a computer motherboard that provides both a reliable mechanical and a reliable electrical connection between the motherboard and a support structure.

SUMMARY OF THE INVENTION

In brief, this is achieved by electronic apparatus comprising a printed circuit board mounted on a support structure, the printed circuit board having at least one keyhole shaped fixing hole, the support structure being provided with at least one electrically conducting fixing post having an at least partially circumferential slot for engaging the fixing hole, wherein the printed circuit board has a conducting surface adjacent said fixing hole that is disposed to provide an electrical contact with said post so as to establish an electrical circuit between at least one component mounted on the printed circuit board and the support structure.

This provides a convenient mounting mechanism which allows the motherboard to be securely mounted on the support structure and to provide an electrical connection thereto.

Preferably the apparatus comprises a resilient washer for engaging the slot. The washer can be electrically conducting and positioned in the slot so as to engage the conducting surface on the printed circuit board.

In one implementation, the fixing post is an integrally formed metallic item and comprises screw-threaded means for mounting said posts on the support structure. This allows the board to be fixed into the screw-threaded holes that are standardly provided on a personal computer chassis.

One advantage of this arrangement is that the motherboard is not present at the time fixing posts are screwed to the chassis, the motherboard being subsequently clipped to the posts. This avoids the risk of damage to the motherboard through slipping of the screwdriver used to mount it. The screwdriver used to mount prior art screw mounted motherboards has been found in practice to be a common source of damage to the motherboards.

BRIEF DESCRIPTION OF THE DRAWINGS

A personal computer embodying the invention will now be described, by way of non-limiting example, with reference to the accompanying diagrammatic drawings, in which.

BEST MODE OF CARRYING OUT THE INVENTION

Figure 1:
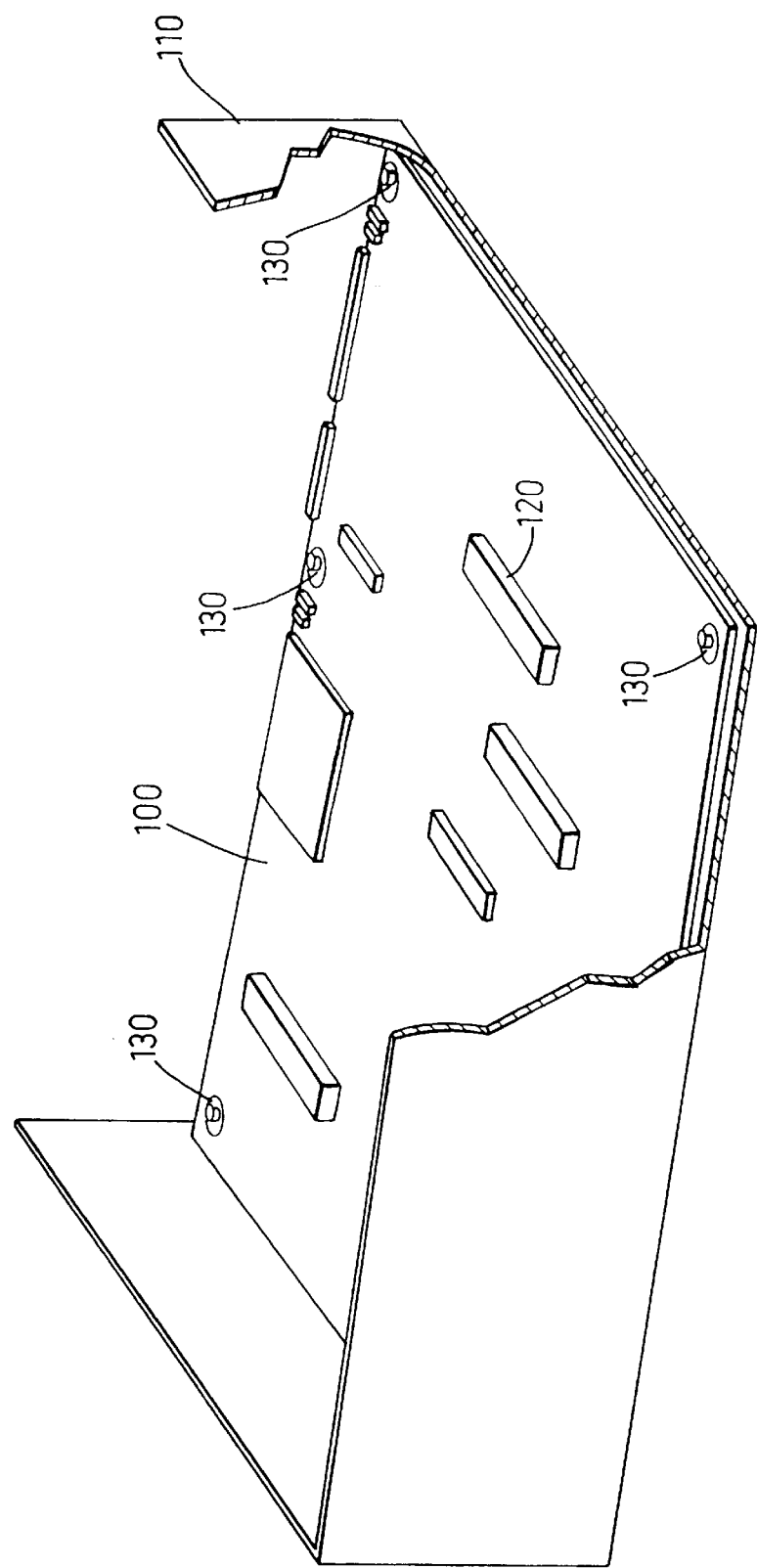
FIG. 1 is a partial cutaway view of a personal computer.

FIG. 1 shows, in partial cut away form, part of a personal computer. As is conventional, the computer comprises a motherboard 100 supporting components 120 and mounted in a casing 110 that serves as a support structure for motherboard 100. The casing 110 is made of a metallic material and also serves as an electromagnetic shield that prevents unwanted electromagnetic radiation escaping from the apparatus when in use. As will be well understood by those skilled in the art, such cases are typically closed by a plastic cover (not shown) coupled with a conducting liner, although many configurations are possible.

Figure 2:
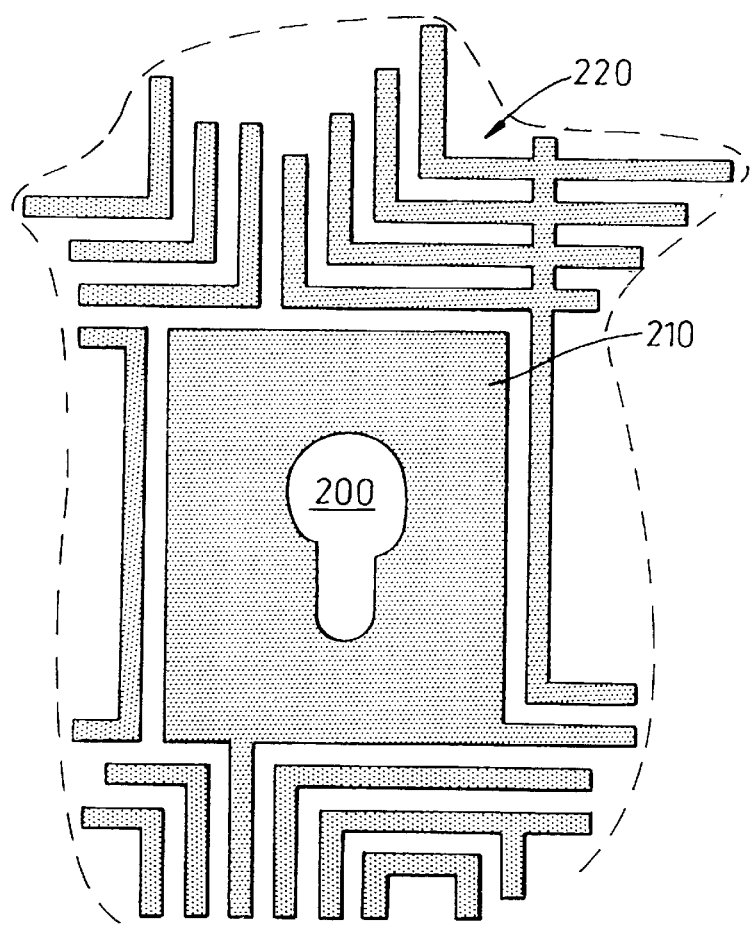
FIG. 2 shows the underside of a motherboard in the region of a fixing hole.

Motherboard 100 is fixed to casing 110 at a number of fixing points 130. FIG. 2 shows the underside of motherboard 100 in the region of each fixing points 130. As can be seen in FIG. 2, motherboard 100 is provided with keyhole shaped fixing holes 200 at the fixing points 130. Each fixing hole 200 is surrounded by a printed conducting portion 210 which serves to provide an ground connection with the casing as described in more detail below. Outside regions 210 the underside of motherboard 100 has a printed wiring pattern 220 for interconnecting the components and connectors mounted on motherboard 100.

Figure 3:
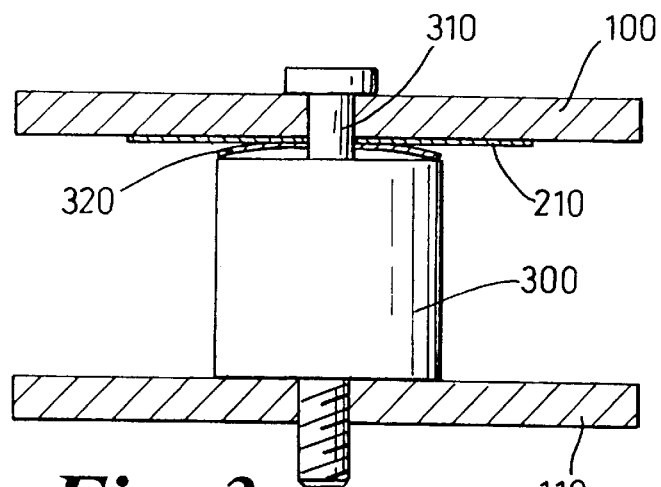
FIG. 3 is a cross-sectional view of a motherboard fixing structure.
Figure 4:
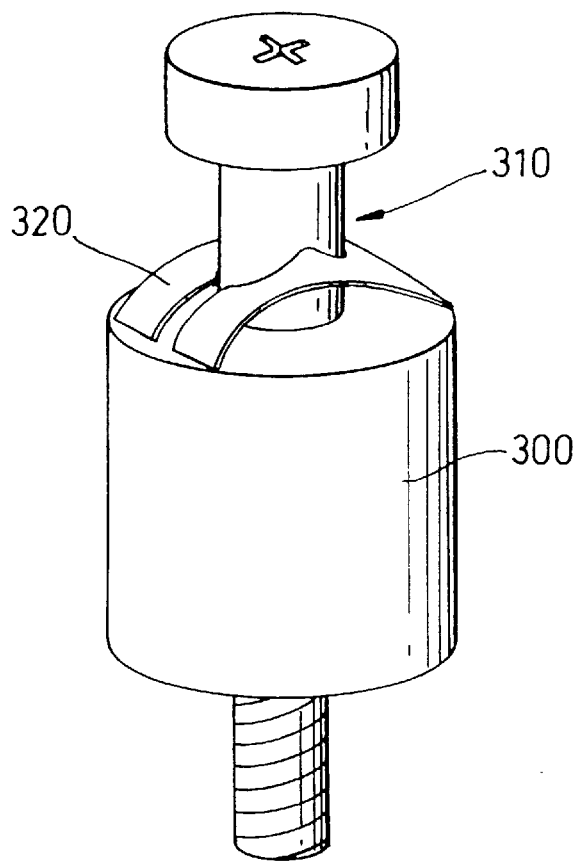
FIG. 4 is a perspective view of a fixing post.

At each fixing point 130, casing 110 is provided with upstanding metallic fixing posts 300 which each have a circumferential slot 310 for engaging the fixing holes. FIG. 3 shows the fixing posts 300, motherboard 100 and casing 110 in cross-section. FIG. 4 is a perspective view of the fixing posts 300.

In the described embodiment, fixing posts 300 are separate integrally formed items that are screwed to casing 110, although it will be understood that they could also be integrally formed with casing 110 or fixed thereto in other ways.

Figure 5:
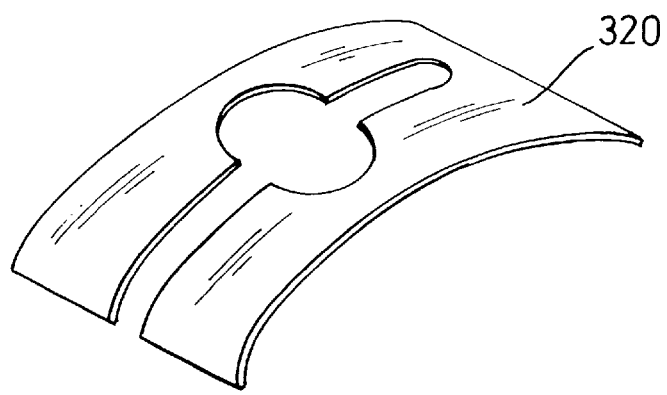
FIG. 5 shows a fixing clip.

In order to provide a tight mechanical fit and a good electrical connection between the underside of motherboard 100 and fixing post 300, a resilient metallic split washer 320 is provided that clips into slot 310. Washer 320 functions as a leaf spring that is laterally compressed when fixing post 300 engages fixing hole 200. The form of washer 320 in this embodiment is shown in FIG. 5. Washer 32 engages region 210 on the underside of motherboard 100 to provide a good electrical contact between the region 210 and the inside of slot 310. Other forms of resilient washers could also be used.

In the preferred embodiment, one of the fixing points will use a conventional screw mounting, which serves to locate the board correctly and prevent the board as a whole coming loose by sliding laterally.

It will be understood that the conducting region 210 could equally be provided on the upper side of motherboard 100 and the washer 320 correspondingly clipped in slot 310 above motherboard 100. Alternatively, washer 320 could be provided primarily to ensure a tight mechanical fit and clipped to slot 310 on the opposite side of motherboard 100 to conducting region 210.

Of course, a similar fixing structure could be used for other types of printed circuit boards mounted on support structures and which require an electrical contact to be made with the support structure.

What is claimed is:

1. Electronic apparatus comprising a printed circuit board mounted on a support structure, the printed circuit board having at least one keyhole shaped fixing hole, the support structure being provided with at least one electrically conducting, integrally formed, metallic fixing post having an at least partially circumferential slot for engaging the fixing hole, wherein the at least one fixing post includes screw-threaded means for mounting the post on the support structure, and wherein the printed circuit board has a conducting surface adjacent said fixing hole that is disposed to provide an electrical contact with said post so as to establish an electrical circuit between at least one component mounted on the printed circuit board and the support structure, the apparatus comprising a resilient electrically conducting split washer that functions as a leaf spring and that is positionable in the slot so as to engage the conducting surface on the printed circuit board.

2. Electronic apparatus as claimed in claim 1 wherein the conducting surface is located on a side of the motherboard facing the support structure.

3. Electronic apparatus as claimed in claim 1 in the form of a personal computer.

4. An electronic apparatus comprising:
   a support structure having a conducting fixing post, said fixing post having an at least partially circumferential slot;
   a printed circuit board mounted on said support structure, said printed circuit board having at least one keyhole shaped fixing hole, said slot of said fixing post engaging said fixing hole, said printed circuit board having a conducting surface adjacent said fixing hole, said conducting surface providing an electrical contact with said fixing post so as to establish an electrical circuit between said support structure and a component mounted on said printed circuit board; and
   a resilient electrically conducting split washer that functions as a leaf spring, said washer being positioned in said slot engaging said conducting surface.

5. The electronic apparatus as in claim 4, wherein said fixing post is an integrally formed metallic item.

6. The electronic apparatus as in claim 4, wherein said fixing post comprises a screw-threaded means for mounting said fixing post on said support structure.

7. The electronic apparatus as in claim 4, wherein said conducting surface is located on a side of a motherboard facing said support structure.

8. The electronic apparatus as in claim 4, wherein the electronic apparatus is a personal computer.

9. An electronic apparatus comprising:
   a support structure
   an electrically conducting fixing post connected to said support structure, said fixing post having a slot defining an upper portion and a lower portion;
   a resilient electrically conducting washer positioned in said slot adjacent said lower portion; and
   a printed circuit board having a fixing hole and a conducting surface adjacent said fixing hole, said fixing hole having a first portion with a first dimension larger than a dimension of said upper portion such that said printed circuit board can be positioned in said slot over said upper portion, said fixing hole having a second portion with a second dimension smaller than said dimension of said upper portion such that said printed circuit board is retained between said upper and lower portions, said printed circuit board engaging said fixing post such that said washer places said conducting surface in electrical communication with said fixing post, wherein said washer has a split portion that allows the washer to be radially positioned in said slot before placing said printed circuit board on said fixing post.

10. The electronic apparatus as in claim 9, wherein said washer functions as a leaf spring to maintain said conducting surface in electrical communication with said fixing post.

11. The electronic apparatus as in claim 9, wherein said split portion has a first width proximate a first edge of said washer and a second width remote from said first edge, wherein a second edge of said washer opposite said first edge does not include said split portion, said first width being smaller than a width of said slot such that said washer is retained on said fixing post when said second width is in said slot.

12. The electronic apparatus as in claim 9, wherein said fixing post comprises a screw-threaded means for mounting said fixing post on said support structure.

13. The electronic apparatus as in claim 9, wherein said printed circuit further comprises a printed wiring pattern in regions, other than said conducting surface.

* * * * *